(12) United States Patent
Casagrande et al.

(10) Patent No.: US 6,567,296 B1
(45) Date of Patent: May 20, 2003

(54) MEMORY DEVICE

(75) Inventors: Giulio Casagrande, Vignate (IT); Tyler Lowrey, San Jose, CA (US); Roberto Bez, Milan (IT); Guy Wicker, Southfield, MI (US); Edward Spall, Manassas, VA (US); Stephen Hudgens, Santa Clara, CA (US); Wolodymyr Czubatyj, Warren, MI (US)

(73) Assignees: STMicroelectronics S.r.l., Agrate Brianza (IT); Ovonyx, Inc., Troy, MI (US)

( * ) Notice: Subject to any disclaimer, the term of this patent is extended or adjusted under 35 U.S.C. 154(b) by 0 days.

(21) Appl. No.: 10/041,684

(22) Filed: Oct. 24, 2001

(51) Int. Cl.⁷ .............................................. G11C 17/06
(52) U.S. Cl. ...................................... 365/105; 365/175
(58) Field of Search ......................... 365/94, 100, 103, 365/104, 105, 163, 175; 257/369

(56) References Cited

U.S. PATENT DOCUMENTS

| | | | | |
|---|---|---|---|---|
| 4,795,657 A | * | 1/1989 | Formigoni et al. | ......... 365/100 |
| 5,166,758 A | * | 11/1992 | Ovshinsky et al. | ......... 365/163 |
| 5,635,745 A | * | 6/1997 | Hoeld | ......................... 257/369 |
| 6,404,665 B1 | * | 6/2002 | Lowrey et al. | ............. 365/100 |

* cited by examiner

Primary Examiner—Trong Phan
(74) Attorney, Agent, or Firm—Allen, Dyer, Doppelt, Milbrath & Gilchrist, P.A.; Lisa K. Jorgenson

(57) ABSTRACT

A memory device including a plurality of memory cells, a plurality of insulated first regions of a first type of conductivity formed in a chip of semiconductor material, at least one second region of a second type of conductivity formed in each first region, a junction between each second region and the corresponding first region defining a unidirectional conduction access element for selecting a corresponding memory cell connected to the second region when forward biased, and at least one contact for contacting each first region; a plurality of access elements are formed in each first region, the access elements being grouped into at least one sub-set consisting of a plurality of adjacent access elements without interposition of any contact, and the memory device further includes means for forward biasing the access elements of each sub-set simultaneously.

20 Claims, 3 Drawing Sheets

MEMORY DEVICE

BACKGROUND OF THE INVENTION

1. Field of the Invention

The present invention relates to a memory device.

2. Discussion of the Related Art

Different types of memory devices have been proposed in the last years. For instance, a phase-change $E^2PROM$ (Electrical Erasable Programmable Read-Only Memory) is a non-volatile memory employing memory cells made of a material that can be electrically switched between a generally amorphous phase and a generally crystalline phase. The phase-change material exhibits different electrical characteristics depending on its state, each one representing a corresponding logic value of the memory cell. An example of a phase-change $E^2PROM$ is described in U.S. Pat. No. 5,166,758.

Each memory cell is individually selected through a corresponding access element, typically consisting of a MOS transistor or a diode. The solution employing the access diodes is more compact, and requires a smaller space in a chip of semiconductor material wherein the access diodes are integrated.

In order to attain a still higher density of the memory device, it would be desirable to arrange several access diodes in a common insulated region of the chip, which defines a common cathode thereof, multiple regions of the opposite type of conductivity extend into the common region and define corresponding anodes of the access diodes.

Unfortunately, the structure described above creates a stray bipolar transistor between each couple of adjacent access diodes. These stray transistors have a detrimental impact on the memory device performance. Particularly, each time the access diode of a selected memory cell is forward biased, a current flows through the access diode from the corresponding anode to the common cathode. However, part of this current is collected by the (unselected) memory cells associated with the same common region through the corresponding stray transistors. This leakage may cause a malfunctioning of the memory device (for example, with the selected memory cell that is not written or read correctly).

Moreover, the current collected by the other memory cells associated with the common region may bring about an undesired change of phase of the corresponding material, with a loss of data stored in the memory device.

A possible solution could be that of providing guard bars with a high level of impurity between the access diodes. In this way, the gain of the stray transistors (and then the amount of current injected into the unselected memory cells) is greatly reduced.

A different solution could be that of arranging a contact region with a high level of impurity between each couple of adjacent access diodes formed in the same common region. These contact regions (defining a common cathode terminal of the access diodes of each common region) directly collect the current from the common region, thereby greatly reducing the amount of current injected into the unselected memory cells.

However, the solutions proposed above are not completely satisfactory. Particularly, these solutions result in a larger area of each memory cell, and then in a reduced density of the memory device. Moreover, they require additional operations, which increase the complexity of the process for producing the memory device (and then its cost).

SUMMARY OF THE INVENTION

It is an object of the present invention to overcome the above-mentioned drawbacks. In order to achieve this object, a memory device as set out in the first claim is proposed.

Briefly, the present invention provides a memory device including a plurality of memory cells, a plurality of insulated first regions of a first type of conductivity formed in a chip of semiconductor material, at least one second region of a second type of conductivity formed in each first region, a junction between each second region and the corresponding first region defining a unidirectional conduction access element for selecting a corresponding memory cell connected to the second region when forward biased, and at least one contact for contacting each first region. A plurality of access elements are formed in each first region, the access elements being grouped into at least one sub-set consisting of a plurality of adjacent access elements without interposition of any contact; the memory device further includes means for forward biasing the access elements of each sub-set simultaneously.

Moreover, the present invention also provides a corresponding method of operating a memory device.

Further features and the advantages of the solution according to the present invention will be made clear by the following description of a preferred embodiment thereof, given purely by way of a non-restrictive indication, with reference to the attached figures, in which:

DETAILED DESCRIPTION

Figure 1:
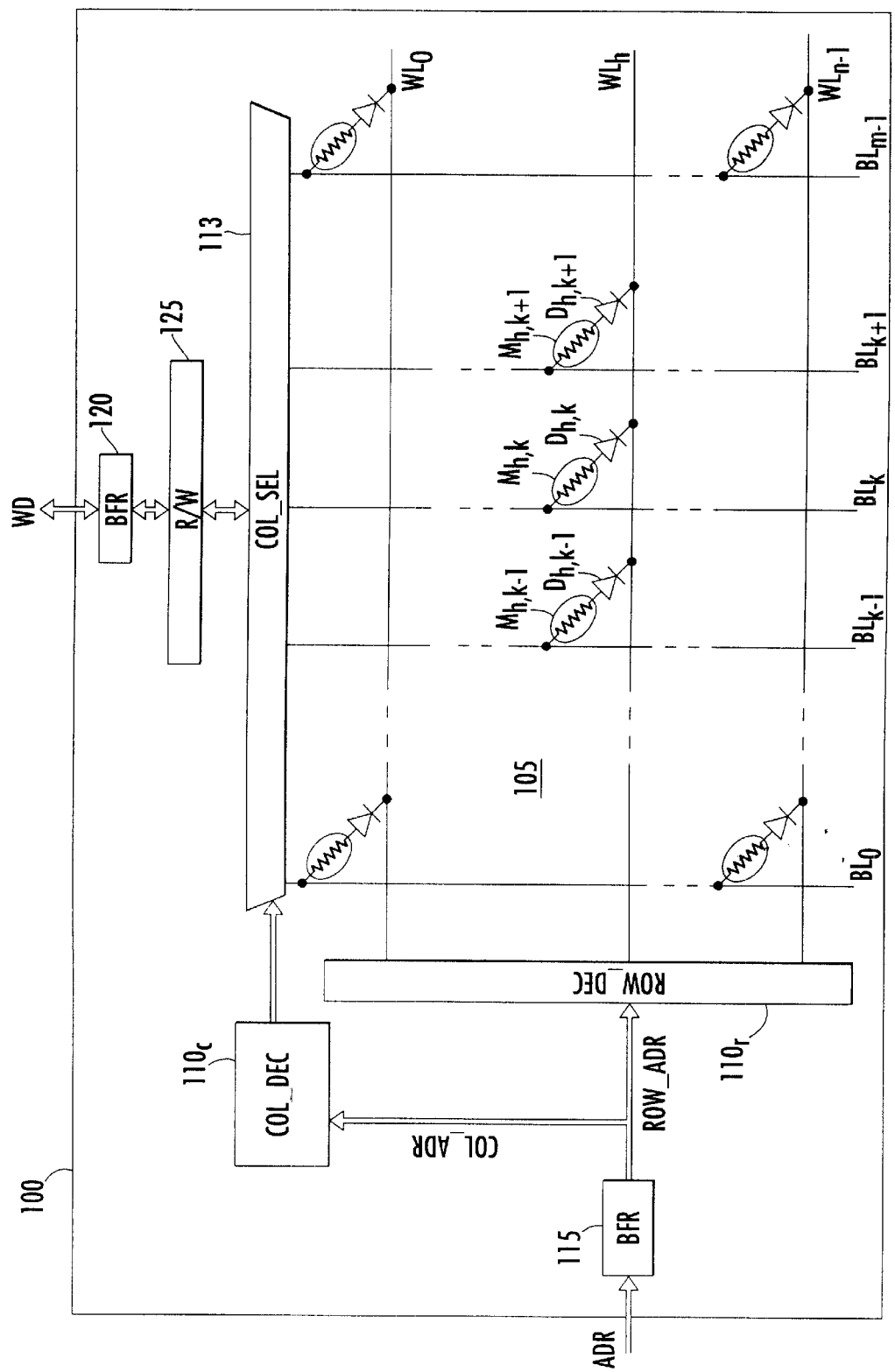
FIG. 1 is a schematic block diagram of the memory device.

With reference in particular to FIG. 1, there is shown a memory device 100 consisting of a phase-change $E^2PROM$. The memory device 100 includes a matrix 105 of memory cells, for example arranged in n=512 rows and m=1024 columns. Each memory cell $M_{h,k}$ (with h=0 ... n−1 and k=0 ... m−1) consists of an element made of a phase-change material, which can be reversibly switched between a generally amorphous, disordered phase and a generally crystalline, high ordered phase. The phase-change material exhibits different electrical characteristics depending on its state. Particularly, the phase-change material in the amorphous phase has a high electrical resistivity (associated with a first logic value, such as 0), whereas the phase-change material in the crystalline phase has a low electrical resistivity (associated with a second logic value, such as 1).

Without descending to particulars well known in the art, the phase of the material is changed by applying a writing voltage having a value corresponding to a desired state of the memory cell $M_{h,k}$ (with respect to a reference voltage, or ground); a corresponding current flowing through the memory cell $M_{h,k}$ causes the material to be left in the amorphous phase or in the crystalline phase according to its value. The state of the memory cell $M_{h,k}$ is detected by applying a reading voltage (having a low value insufficient to change the phase of the material); the resulting current flowing through the memory cell $M_{h,k}$ is a signature of the resistivity of the material and then of its phase.

Each memory cell $M_{h,k}$ is connected in series to a respective access diode $D_{h,k}$, between a corresponding word line $WL_h$ and a corresponding bit line $BL_k$. More specifically, the memory cells of each column (from $M_{0,k}$ to $M_{n-1,k}$) have a first terminal connected to the corresponding bit line $BL_k$. A second terminal of each memory cell $M_{h,k}$ is connected to an anode of the respective access diode $D_{h,k}$. The access diodes of each row (from $D_{h,0}$ to $D_{h,m-1}$) have a cathode connected to the corresponding word line $WL_h$. In this way, each couple word line/bit line addresses a single memory cell $M_{h,k}$ and respective access diode $D_{h,k}$ of the matrix 105.

A row decoder (ROW_DEC) 110r is used to select the word lines of the matrix 105; a column decoder (COL_DEC) 110c is used to drive a column selector or multiplexer (COL_SEL) 113, which selects the bit lines of the matrix 105. An address (ADR) is input to a buffer (BFR) 115. The address ADR consists of two portions: a row address ROW_ADR and a column address COL_ADR. The row address ROW_ADR is supplied to the row decoder 110r, while the column address COL_ADR is supplied to the column decoder 110c.

The memory device simultaneously processes a word (WD), consisting for example of 16 bits. The word WD is supplied to a further buffer (BFR) 120, which is connected to the column selector 113 through a read/write unit (R/W) 125. The read/write unit 125 includes all the components (such as sense amplifiers, comparators, charge pumps, reference cells, pulse generators, and the like) that are used for writing the memory cells or for reading their value.

During a writing or reading operation of a word, the corresponding bit lines selected by the column address COL_ADR are brought to the writing or reading voltage, while the other bit lines are kept at a low voltage (typically ground) or are left floating; the word line selected by the row address ROW_ADR is driven to a low voltage (typically ground), while the other word lines are kept at a high voltage (typically equal to the writing or reading voltage). In this way, only the access diodes associated with the selected bit lines and the selected word line are forward biased (while the other access diodes are reverse biased). Therefore, during a writing operation the writing voltage applied to the selected bit lines brings the corresponding memory cells in the selected word line to the desired state; on the other hand, during a reading operation the current flowing through the selected bit lines is compared with a reference value (for example, provided by reference cells), in order to detect the state of the corresponding memory cells in the selected word line.

Similar considerations apply if the memory device has a different structure and capacity, if the matrix has a different number of rows and columns, if different writing and/or reading procedures are employed, and the like.

Figure 2:
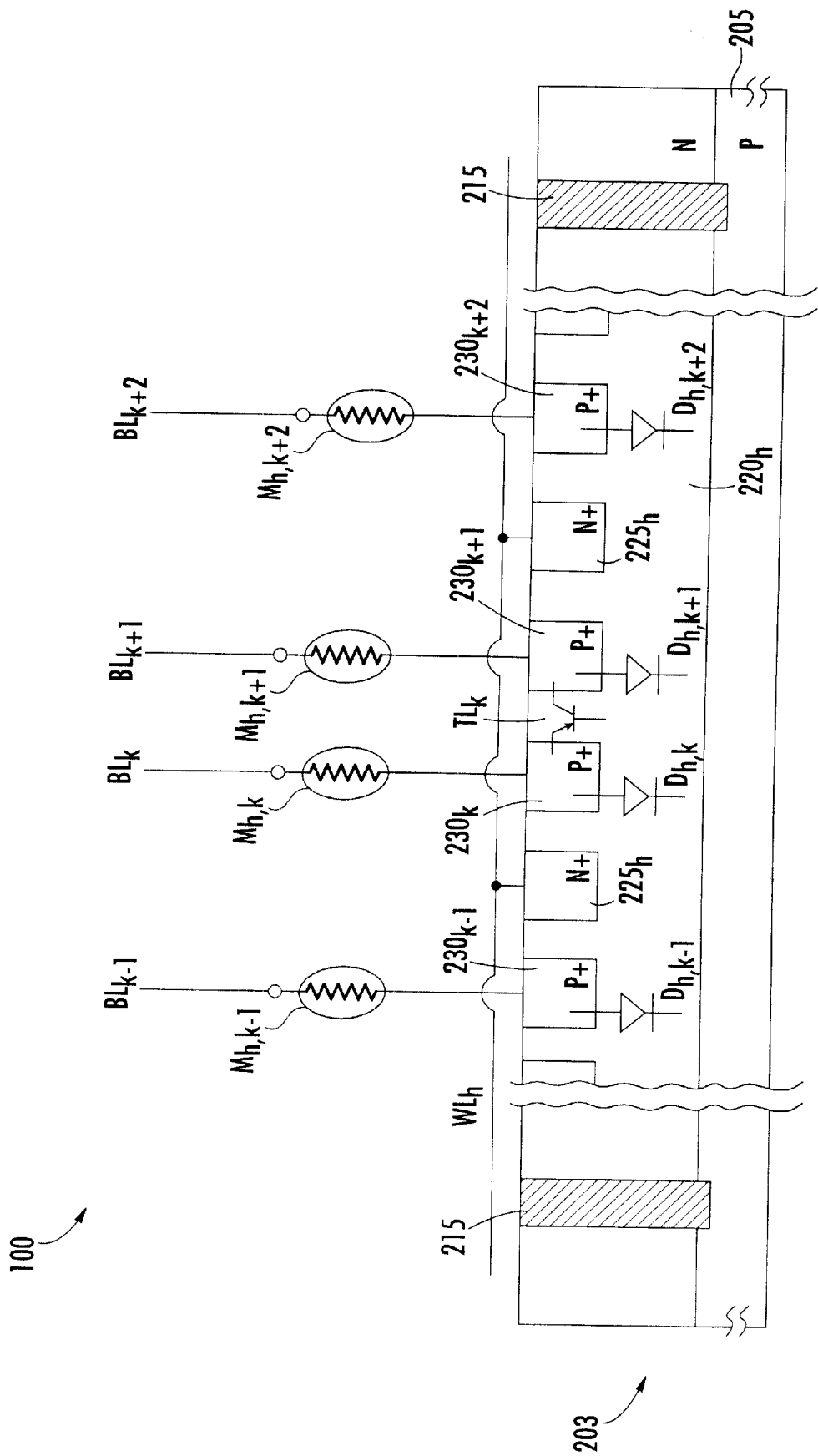
FIG. 2 shows the structure of a portion of the memory device in cross-section.

With reference now to FIG. 2, the memory device 100 is integrated in a chip of semiconductor material 203 using a standard CMOS process. The chip 203 has a substrate 205 of the P type; a layer of the N type is implanted and diffused into the substrate 205. A series of trenches 215 extending from an upper surface of the chip as far as the substrate 205 define corresponding insulated regions 220 of the N type. A generic region $220_h$ is associated with a corresponding word line $WL_h$; more specifically, one or more contact regions $225_h$ of the N+ type (with a level of impurity higher than the one of the region $220_h$) are used to connect the region $220_h$ to the word line $WL_h$ (made of a metal strip running along a series of adjacent regions $220_h$).

Multiple regions 230 of the P+ type (for example some tens) extend from the upper surface of the chip into each region 220. The P-N junction formed between a generic region $230_k$ (of the P+ type) and the corresponding region $220_h$ (of the N type) defines the access diode $D_{h,k}$. More specifically, the access diode $D_{h,k}$ consists of an emitter-base junction of a vertical PNP transistor, which is formed by the region $230_k$ of the P+ type (acting as an emitter when the access diode $D_{h,k}$ is forward biased), the region $220_h$ of the N type (acting as a base), and the substrate 205 of the P type (acting as a collector, which is typically kept at the reference voltage). The region $230_k$ is an anode of the access diode $D_{h,k}$, which is connected to the corresponding memory cell $M_{h,k}$; the region $220_h$ is a common cathode of the access diodes therein formed.

The access diodes of each region $220_h$ are grouped into multiple sub-sets, each one consisting of two (or more) adjacent access diodes (such as the diodes $D_{h,k}, D_{h,k+1}$ in the example shown in the figure). The access diodes of each sub-set are arranged between two consecutive contact regions $225_h$, or between a trench 215 and a (first or last) contact region $225_h$; in this way, no contact region $225_h$ is interposed between the access diodes of each sub-set. The access diodes of corresponding sub-sets in each row of the matrix are associated with a corresponding sub-set of adjacent bit lines; for example, the sub-sets of access diodes $D_{0,k}, D_{0,k+1} \ldots D_{h,k}, D_{h,k+1} \ldots D_{n-1,k}, D_{n-1,k+1}$ are associated with the sub-set of bit lines $BL_k, BL_{k+1}$.

When a memory cell is selected (such as the memory cell $M_{h,k}$), the writing or reading voltage is applied to the corresponding bit line $BL_k$; this voltage forward biases the access diode $D_{h,k}$, so that a corresponding current flows from the region $230_k$ to the region $220_h$ (and then through the memory cell $M_{h,k}$); the current is collected by the word line $WL_h$ (through the contact regions $225_h$).

In the structure described above, a lateral bipolar transistor TL is formed between each couple of adjacent access diodes. Particularly, a lateral transistor $TL_k$ is formed by the region $230_k$ of the P+ type (acting as emitter or collector according to the biasing of the access diode $D_{h,k}$), the region $220_h$ of the N type (base), and the region $230_{k+1}$ of the P+ type (collector or emitter). However, when a contact region $225_h$ is interposed between two regions 230, the effect of the corresponding lateral transistor can be deemed negligible.

In a conventional memory device, a single memory cell (such the memory cell $M_{h,k}$) of the region $220_h$ is selected at a time by forward biasing the access diode $D_{h,k}$, while the other access diodes of the region $220_h$ are insulated by the reverse biasing of the corresponding P-N junctions. Therefore, the lateral transistors TL cause part of the current flowing through the bit line $BL_k$ to be collected by the other memory cells. The leakage may bring about a malfunctioning of the writing or reading operation on the selected memory cell $M_{h,k}$; moreover, this current disturbs the neighboring cells, with degradation over time of their state.

Conversely, in the proposed solution all the access diodes of each sub-set are forward biased simultaneously for selecting the corresponding memory cells at the same time during a writing or reading operation. As a consequence, the collector-base biasing of the stray transistors TL is strongly reduced, so that any leakage between adjacent access diodes is substantially avoided. For example, the memory cells $M_{h,k}, M_{h,k+1}$ are simultaneously selected by forward biasing the access diodes $D_{h,k}, D_{h,k+1}$; therefore, the leakage through the stray transistor $TL_k$ is very little (while the contact region $225_h$ substantially avoids any leakage between the regions $230_{k-1}, 230_k$ and between the regions $230_{k+1}, 230_{k+2}$).

Naturally, any practical implementation of the solution described above must be tuned as a trade-off between the opposed requirements of having a high density of the memory device and a good performance thereof, for example controlling a total current through the base and the collector of the transistors, the number of adjacent access diodes, the device engineering, the layout of the structure, the level of impurities, and so on.

Similar considerations apply if the memory device is made with a different technology (for example using a bipolar process), if the regions of the P type are replaced by regions of the N type and vice versa, if each word line is associated with a different number of common regions (down to a single one), if a different number of access diodes are formed in each common region, if the insulated regions are contacted directly, and the like.

Figure 3:
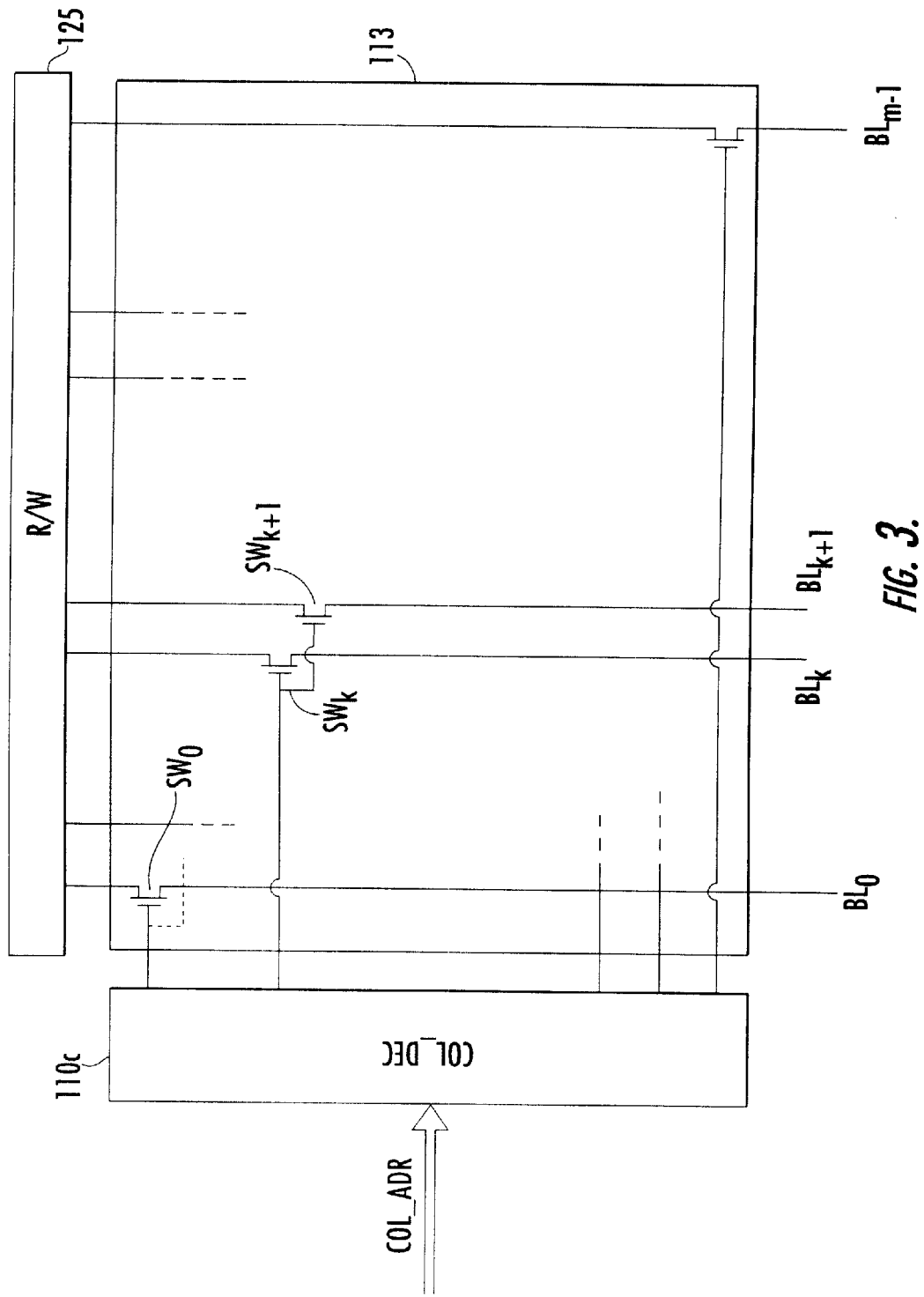
FIG. 3 is a diagrammatical representation of a column selector of the memory device.

As shown in FIG. 3, the column address COL_ADR is supplied to the column decoder 110c; the column decoder 110c has as many output terminals as the number of sub-sets of bit lines (1024/2=512 in the example at issue). The column decoder 110c brings the output terminal corresponding to the column address COL_ADR to a selection voltage, while the other output terminals are kept at the reference voltage.

The column selector 113 includes an electronic switch SW for each bit line BL. The switch SW consists of a MOS transistor having a drain terminal connected to the read/write unit 125, and a source terminal connected to the memory cells of the corresponding column. A gate terminal of the switch SW is connected to the column decoder 110c; particularly, the gate terminals of the switches associated with the bit lines of the same sub-set (such as the switches $SW_k$ and $SW_{k+1}$ in the example shown in the figure) are connected to a single output terminal of the column decoder 110c.

In this way, when the column address COL_ADR selects a sub-set of the bit lines BL, the corresponding switches SW are on (due to the selection voltage applied to their gate terminals by the column decoder 110c), while the other switches are off. The read/write unit 125 then supplies the writing or reading voltage simultaneously to all the bit lines of the sub-set (being effective only on the memory cells of the sub-set belonging to the selected word line). The same operations are concurrently performed for other sub-sets of the bit lines BL, in order to read/write a word at a time (for example, they are performed for eight sub-sets each one of two bit lines for a word of 16 bits).

Similar considerations apply if the column selector has a different structure, if different elements are used to connect the bit lines to the read/write unit selectively, and the like.

More generally, the present invention provides a memory device including a plurality of memory cells. A plurality of insulated first regions of a first type of conductivity are formed in a chip of semiconductor material. A plurality of second regions of a second type of conductivity are formed in each first region; a junction between each second region and the corresponding first region defines a unidirectional conduction access element for selecting a corresponding memory cell connected to the second region when forward biased. In addition, the memory device includes one or more contacts for contacting each first region. The access elements formed in each first region are grouped into one or more sub-sets; each sub-set consists of a plurality of adjacent access elements without interposition of any contact. The memory device further includes means for forward biasing the access elements of each sub-set simultaneously.

The solution of the invention results in a very dense memory device, by the sharing of the cathodes of the access diodes among multiple memory cells. At the same time, the ill effects of the stray transistors formed between adjacent access diodes are avoided (or at least reduced).

This result is achieved with minimum changes to the standard process employed for producing the memory device. As a consequence, the structure of the invention allows a very dense memory device to be produced at a relatively low cost.

The preferred embodiment of the invention described above offers further advantages. For example, the proposed solution is implemented in a device having the memory cells arranged in a matrix with corresponding word lines and bit lines; the bit lines are grouped into sub-sets associated with the access diodes of corresponding sub-sets in each row of the matrix. The writing voltage is applied to all the bit lines of each sub-set simultaneously. In this way, the invention only requires some minor changes to the column selector, while it does not affect the remaining structure of the memory device. Moreover, the memory cells of each sub-set are simultaneously selected during the writing operation, when the ill effects of the leakage caused by the stray transistors is more dangerous.

Preferably, the reading voltage is also applied to all the bit lines of each sub-set simultaneously. In this way, the memory cells of each sub-set are simultaneously selected during the reading operation as well.

Similar considerations apply if the memory cells are arranged in a different manner, if the word lines and bit lines are replaced by equivalent selection lines, and so on. However, the solution of the invention leads itself to be carried out even in a memory device wherein some of the memory cells of the sub-set are written while the other ones are read, or wherein although all the access diodes of each sub-set are simultaneously forward biased only some of the memory cells associated therewith are actually written or read.

In a preferred embodiment of the present invention, each sub-set consists of two adjacent access diodes. The inventors have discovered that this value is a good compromise between the opposed requirements of increasing the density of the memory device and reducing the total current through the base and the collector of the transistors.

Moreover, each common region includes two or more sub-sets of adjacent access diodes; in this way, the advantageous effects provided by the solution of the invention are better exploited.

Alternatively, the memory device is implemented with a different number of access diodes in each sub-set (even with a number that is not a sub multiple of the bits in the word of the memory device), or with a different number of sub-sets of access diodes in each common region (down to a single one, with the contact regions that are arranged close to the trenches).

Preferably, the anode of each access diode is connected to the corresponding memory cell, whereas the access diodes of each sub-set share a common cathode.

Moreover, the devised solution is particularly advantageous in a memory device using memory cells made of a phase-change material.

Similar considerations apply if the access diodes are made with a different technology, or if each memory cell stores multiple bits (with different resistive states of the crystalline phase). Alternatively, the access diodes are replaced by equivalent unidirectional conduction elements, the access diodes share a common anode, each memory cell consists of a magneto-resistive element or a programmable fuse, and the like.

Naturally, in order to satisfy local and specific requirements, a person skilled in the art may apply to the solution described above many modifications and alterations all of which, however, are included within the scope of protection of the invention as defined by the following claims.

What is claimed is:

1. A memory device including a plurality of memory cells, a plurality of insulated first regions of a first type of conductivity formed in a chip of semiconductor material, at least one second region of a second type of conductivity formed in each first region, a junction between each second region and the corresponding first region defining a unidirectional conduction access element for selecting a corresponding memory cell connected to the second region when forward biased, and at least one contact for contacting each first region, wherein a plurality of access elements are formed in each first region, the access elements being grouped into at least one sub-set consisting of a plurality of adjacent access elements without interposition of any contact, and the memory device further includes means for forward biasing the access elements of each sub-set simultaneously.

2. The memory device according to claim 1, wherein the memory cells and access elements are arranged in a matrix having a plurality of rows and a plurality of columns with the access elements of each sub-set arranged along a corresponding row, the contacts associated with the access elements of each row being connected to a corresponding first selection line and the memory cells of each column being connected to a corresponding second selection line, and wherein the second selection lines are grouped into a plurality of further sub-sets associated with the access elements of corresponding sub-sets in each row, the means for forward biasing including means for applying a writing voltage to the second selection lines of each further sub-set simultaneously.

3. The memory device according to claim 2, wherein the means for forward biasing further includes means for applying a reading voltage to the second selection lines of each further sub-set simultaneously.

4. The memory device according to claim 1, wherein each sub-set comprises two access elements.

5. The memory device according to claim 1, wherein the access elements formed in each first region are grouped into a plurality of sub-sets.

6. The memory device according to claim 1, wherein each access element is a diode, the second region being an anode of the P-type and the first region being a cathode of the N-type.

7. The memory device according to claim 1, wherein each memory cell includes a phase change element suitable to be switched between at least two different states each one associated with a corresponding logic value of the memory cell.

8. A method of operating a memory device including a plurality of memory cells, a plurality of insulated first regions of a first type of conductivity formed in a chip of semiconductor material, a plurality of second regions of a second type of conductivity formed in each first region, a junction between each second region and the corresponding first region defining a unidirectional conduction access element for selecting a corresponding memory cell connected to the second region when forward biased, and at least one contact for contacting each first region, the method including the steps of:

grouping the access elements formed in each first region into at least one sub-set consisting of a plurality of adjacent access elements without interposition of any contact, and forward biasing the access elements of each sub-set simultaneously.

9. The method according to claim 8, wherein the memory cells and access elements are arranged in a matrix having a plurality of rows and a plurality of columns with the access elements of each sub-set arranged along a corresponding row, the contacts associated with the access elements of each row being connected to a corresponding first selection line and the memory cells of each column being connected to a corresponding second selection line, and wherein the second selection lines are grouped into a plurality of further sub-sets associated with the access elements of corresponding sub-sets in each row, the method further including the step of:

applying a writing voltage to the second selection lines of each further sub-set simultaneously.

10. The method according to claim 9, further includes the step of:

applying a reading voltage to the second selection lines of each further sub-set simultaneously.

11. A memory device comprising:

a plurality of memory cells;

a semiconductor substrate;

a plurality of insulated first regions of a first type of conductivity formed in the semiconductor substrate;

at least one contact for contacting each first region;

a plurality of second regions of a second type of conductivity formed in each first region;

junctions between second regions and the corresponding first region defining a plurality of access elements for selecting a corresponding memory cell connected to the second region when forward biased, the access elements being grouped into at least one sub-set including a plurality of adjacent access elements without interposition of any contact; and a selection circuit for forward biasing the access elements of each sub-set simultaneously.

12. The memory device according to claim 11, further comprising a plurality of first selection lines and a plurality of second selection lines; wherein the memory cells and access elements are arranged in a matrix having a plurality of rows and a plurality of columns with the access elements of each sub-set arranged along a corresponding row; the contacts associated with the access elements of each row being connected to a corresponding first selection line and memory cells of each column being connected to a corresponding second selection line; and wherein the second selection lines are grouped into a plurality of further sub-sets associated with the access elements of corresponding sub-sets in each row; and the selection circuit applies a writing voltage to the second selection lines of each further sub-set simultaneously.

13. The memory according to claim 12, wherein the selection circuit applies a reading voltage to the second selection lines of each further sub-set simultaneously.

14. The memory device according to claim 11, wherein each sub-set comprises two access elements.

15. The memory device according to claim 11, wherein the access elements formed in each first region are grouped into a plurality of sub-sets.

16. The memory device according to claim 11, wherein each access element is a diode, the second region being a P-type anode and the first region being an N-type cathode.

17. The memory device according to claim 11, wherein each memory cell includes a phase change element switchable between at least two different states with each state being associated with a corresponding logic value of the memory cell.

18. A method of operating a memory device including a plurality of memory cells, a plurality of insulated first regions of a first type of conductivity formed in a semiconductor substrate, a plurality of second regions of a second type of conductivity formed in each first region, a junction between each second region and the corresponding first region defining an access element for selecting a corresponding memory cell connected to the second region when forward biased, and at least one contact for contacting each first region, the method comprising:

grouping the access elements formed in each first region into at least one sub-set including a plurality of adjacent access elements without interposition of any contact; and forward biasing the access elements of each sub-set simultaneously.

19. The method according to claim 18, wherein the memory device further comprises a plurality of first selection lines and a plurality of second selection lines; wherein the memory cells and access elements are arranged in a matrix having a plurality of rows and a plurality of columns with the access elements of each sub-set arranged along a corresponding row; the contacts associated with the access elements of each row being connected to a corresponding first selection line and memory cells of each column being connected to a corresponding second selection line; and wherein the second selection lines are grouped into a plurality of further sub-sets associated with the access elements of corresponding sub-sets in each row; the method further comprising applying a writing voltage to the second selection lines of each further sub-set simultaneously.

20. The method according to claim 19, further comprising applying a reading voltage to the second selection lines of each further sub-set simultaneously.

* * * * *